(12) United States Patent
Cich et al.

(10) Patent No.: US 8,802,471 B1
(45) Date of Patent: Aug. 12, 2014

(54) CONTACTS FOR AN N-TYPE GALLIUM AND NITROGEN SUBSTRATE FOR OPTICAL DEVICES

(71) Applicant: Soraa, Inc., Fremont, CA (US)

(72) Inventors: Michael J. Cich, Fremont, CA (US); Kenneth John Thomson, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/723,968

(22) Filed: Dec. 21, 2012

(51) Int. Cl.
*H01L 33/00* (2010.01)

(52) U.S. Cl.
USPC .......... 438/46; 438/28; 438/29; 257/76; 257/13; 257/79; 257/E33.025; 257/E33.068

(58) Field of Classification Search
CPC ............ H01L 21/30617; H01L 21/76826; H01L 29/20; H01L 33/007; H01L 33/32; H01L 33/22; H01L 33/16; H01L 33/20; H01L 21/02458
USPC .................... 438/28; 257/E33.025
See application file for complete search history.

(56) References Cited

U.S. PATENT DOCUMENTS

| | | | |
|---|---|---|---|
| 4,065,688 A | 12/1977 | Thornton | |
| 4,870,045 A * | 9/1989 | Gasper et al. | 502/232 |
| 5,331,654 A | 7/1994 | Jewell et al. | |
| 5,607,899 A | 3/1997 | Yoshida et al. | |
| 5,632,812 A | 5/1997 | Hirabayashi | |
| 5,764,674 A | 6/1998 | Hibbs-Brenner et al. | |
| 5,813,753 A | 9/1998 | Vriens et al. | |
| 6,335,771 B1 | 1/2002 | Hiraishi | |
| 6,498,355 B1 | 12/2002 | Harrah et al. | |
| 6,501,154 B2 | 12/2002 | Morita et al. | |
| 6,509,651 B1 | 1/2003 | Matsubara et al. | |
| 6,533,874 B1 | 3/2003 | Vaudo et al. | |
| 6,547,249 B2 | 4/2003 | Collins, III et al. | |
| 6,680,959 B2 | 1/2004 | Tanabe et al. | |
| 6,734,461 B1 | 5/2004 | Shiomi et al. | |
| 6,809,781 B2 | 10/2004 | Setlur et al. | |
| 6,956,246 B1 | 10/2005 | Epler et al. | |
| 7,009,199 B2 | 3/2006 | Hall | |
| 7,012,279 B2 | 3/2006 | Wierer, Jr. et al. | |
| 7,128,849 B2 | 10/2006 | Setlur et al. | |
| 7,285,801 B2 | 10/2007 | Eliashevich et al. | |

(Continued)

FOREIGN PATENT DOCUMENTS

| | | |
|---|---|---|
| EP | 2381490 | 10/2011 |
| JP | 06-334215 | 12/1994 |

(Continued)

OTHER PUBLICATIONS

Selvanathan et al. "Investigation of surface treatment schemes on n-type GaN and $Al_{0.20}Ga_{0.80}N$", J. Vac. Sci. Technol. B, vol. 23, No. 6, Nov./Dec. 2005.*

(Continued)

*Primary Examiner* — Jarrett Stark
*Assistant Examiner* — Bitew Dinke
(74) *Attorney, Agent, or Firm* — Kilpatrick Townsend & Stockton LLP

(57) ABSTRACT

Techniques for manufacturing optical devices are disclosed. More particularly, light emitting diodes and in particular to ohmic contacts for light emitting diodes are disclosed.

18 Claims, 7 Drawing Sheets

(56) References Cited

U.S. PATENT DOCUMENTS

| | | |
|---|---|---|
| 7,303,630 B2 | 12/2007 | Motoki et al. |
| 7,341,880 B2 | 3/2008 | Erchak et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,419,281 B2 | 9/2008 | Porchia et al. |
| 7,470,938 B2* | 12/2008 | Lee et al. .................... 257/103 |
| 7,483,466 B2 | 1/2009 | Uchida et al. |
| 7,489,441 B2 | 2/2009 | Scheible et al. |
| 7,622,742 B2 | 11/2009 | Kim et al. |
| 7,733,571 B1 | 6/2010 | Li |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,923,741 B1 | 4/2011 | Zhai et al. |
| 8,044,412 B2 | 10/2011 | Murphy et al. |
| 8,142,566 B2 | 3/2012 | Kiyomi et al. |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,293,551 B2 | 10/2012 | Sharma et al. |
| 8,310,143 B2 | 11/2012 | Van De Ven et al. |
| 8,314,429 B1 | 11/2012 | Raring et al. |
| 8,455,894 B1 | 6/2013 | D'Evelyn et al. |
| 8,502,465 B2 | 8/2013 | Katona et al. |
| 2001/0009134 A1 | 7/2001 | Kim et al. |
| 2001/0043042 A1 | 11/2001 | Murazaki et al. |
| 2001/0055208 A1 | 12/2001 | Kimura |
| 2002/0070416 A1 | 6/2002 | Morse et al. |
| 2002/0096994 A1 | 7/2002 | Iwafuchi et al. |
| 2002/0155691 A1* | 10/2002 | Lee et al. .................... 438/604 |
| 2002/0182768 A1 | 12/2002 | Morse et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0047076 A1 | 3/2003 | Liu |
| 2003/0138732 A1* | 7/2003 | Nagase ................... 430/302 |
| 2003/0164507 A1 | 9/2003 | Edmond et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0207998 A1 | 10/2004 | Suehiro et al. |
| 2004/0251471 A1 | 12/2004 | Dwilinski et al. |
| 2005/0087753 A1 | 4/2005 | D'Evelyn et al. |
| 2005/0121679 A1 | 6/2005 | Nagahama et al. |
| 2005/0167680 A1 | 8/2005 | Shei et al. |
| 2005/0199899 A1 | 9/2005 | Lin et al. |
| 2005/0214992 A1 | 9/2005 | Chakraborty et al. |
| 2005/0224830 A1 | 10/2005 | Blonder et al. |
| 2005/0263791 A1 | 12/2005 | Yanagihara et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0079082 A1 | 4/2006 | Bruhns et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0189098 A1 | 8/2006 | Edmond |
| 2006/0214287 A1 | 9/2006 | Ogihara et al. |
| 2006/0255343 A1 | 11/2006 | Ogihara et al. |
| 2006/0273339 A1 | 12/2006 | Steigerwald et al. |
| 2007/0045200 A1 | 3/2007 | Moon et al. |
| 2007/0093073 A1 | 4/2007 | Farrell, Jr. et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0202624 A1 | 8/2007 | Yoon et al. |
| 2007/0231978 A1* | 10/2007 | Kanamoto et al. ........... 438/154 |
| 2007/0264733 A1* | 11/2007 | Choi et al. .................... 438/22 |
| 2007/0280320 A1 | 12/2007 | Feezell et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083929 A1 | 4/2008 | Fan et al. |
| 2008/0087919 A1 | 4/2008 | Tysoe et al. |
| 2008/0096470 A1* | 4/2008 | Hou et al. .................... 451/36 |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0142781 A1 | 6/2008 | Lee |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0194054 A1 | 8/2008 | Lin et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0261381 A1 | 10/2008 | Akiyama et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0303033 A1 | 12/2008 | Brandes |
| 2009/0065798 A1 | 3/2009 | Masui et al. |
| 2009/0072252 A1 | 3/2009 | Son et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0140279 A1 | 6/2009 | Zimmerman et al. |
| 2009/0146170 A1 | 6/2009 | Zhong et al. |
| 2009/0194796 A1 | 8/2009 | Hashimoto et al. |
| 2009/0206354 A1 | 8/2009 | Kitano et al. |
| 2009/0227056 A1 | 9/2009 | Kyono et al. |
| 2009/0250686 A1 | 10/2009 | Sato et al. |
| 2009/0267098 A1 | 10/2009 | Choi |
| 2009/0273005 A1 | 11/2009 | Lin |
| 2009/0309110 A1 | 12/2009 | Raring et al. |
| 2009/0315480 A1 | 12/2009 | Yan et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0032691 A1 | 2/2010 | Kim |
| 2010/0055819 A1 | 3/2010 | Ohba et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0148145 A1 | 6/2010 | Ishibashi et al. |
| 2010/0155746 A1 | 6/2010 | Ibbetson et al. |
| 2010/0195687 A1 | 8/2010 | Okamoto et al. |
| 2010/0220262 A1 | 9/2010 | DeMille et al. |
| 2010/0240158 A1 | 9/2010 | Ter-Hovhannissian |
| 2010/0290208 A1 | 11/2010 | Pickard |
| 2010/0295088 A1 | 11/2010 | D'Evelyn et al. |
| 2010/0200837 A1 | 12/2010 | Zimmerman et al. |
| 2010/0309943 A1 | 12/2010 | Chakraborty et al. |
| 2011/0017298 A1 | 1/2011 | Lee |
| 2011/0056429 A1 | 3/2011 | Raring et al. |
| 2011/0075694 A1 | 3/2011 | Yoshizumi et al. |
| 2011/0101400 A1* | 5/2011 | Chu et al. .................... 257/98 |
| 2011/0101414 A1* | 5/2011 | Thompson et al. ........... 257/103 |
| 2011/0108081 A1 | 5/2011 | Werthen et al. |
| 2011/0124139 A1* | 5/2011 | Chang .................... 438/40 |
| 2011/0175200 A1 | 7/2011 | Yoshida |

(56) References Cited

U.S. PATENT DOCUMENTS

| | | | |
|---|---|---|---|
| 2011/0180781 A1 | 7/2011 | Raring et al. | |
| 2011/0182056 A1 | 7/2011 | Trottier et al. | |
| 2011/0186860 A1* | 8/2011 | Enya et al. | 257/76 |
| 2011/0186874 A1 | 8/2011 | Shum | |
| 2011/0216795 A1 | 9/2011 | Hsu et al. | |
| 2011/0260189 A1* | 10/2011 | Kim | 257/98 |
| 2011/0266552 A1 | 11/2011 | Tu et al. | |
| 2012/0007102 A1 | 1/2012 | Feezell et al. | |
| 2012/0104359 A1* | 5/2012 | Felker et al. | 257/14 |
| 2012/0104412 A1* | 5/2012 | Zhong et al. | 257/76 |
| 2012/0135553 A1 | 5/2012 | Felker et al. | |
| 2012/0187412 A1 | 7/2012 | D'Evelyn et al. | |
| 2012/0199841 A1 | 8/2012 | Batres et al. | |
| 2012/0288974 A1 | 11/2012 | Sharma et al. | |
| 2013/0022758 A1 | 1/2013 | Trottier | |
| 2013/0026483 A1 | 1/2013 | Sharma et al. | |
| 2013/0112987 A1* | 5/2013 | Fu et al. | 257/76 |
| 2013/0126902 A1* | 5/2013 | Isozaki et al. | 257/76 |
| 2013/0234108 A1 | 9/2013 | David et al. | |
| 2014/0050244 A1* | 2/2014 | Ohno et al. | 372/46.01 |

FOREIGN PATENT DOCUMENTS

| | | |
|---|---|---|
| JP | 1997-082587 | 3/1997 |
| JP | 1999-340507 | 12/1999 |
| JP | 1999-340576 | 12/1999 |
| JP | 2001-177146 | 6/2001 |
| JP | 2003-031844 | 1/2003 |
| JP | 2007-110090 | 4/2007 |
| JP | 2008-084973 | 4/2008 |
| JP | 2008-172040 | 7/2008 |
| WO | WO 2006/062880 | 6/2006 |
| WO | WO 2009/001039 | 12/2008 |

OTHER PUBLICATIONS

Min Lu et al. "Etch-Pits of GaN Films with Different Etching Methods", Journal of the Korean Physical Society, vol. 45, Dec. 2004.*

Semendy et al. "Observation and Study of Dislocation Etch Pits in Molecular Beam Epitaxy Grown Gallium Nitride with the use of Phosphoric Acid and Molten Potassium Hydroxide", Army Reaserch Laboratory. Jun. 2007.*

Aguilar. "Ohmic n-contacts to Gallium Nitride Light Emitting Diodes", National Nanotechnologhy Infrastructure Network. 2007.*

Rickert et al. "n-GaN surface treatments for metal contacts studied vua X-ray photoemission spectroscopy", Appl. Phys. Lett., vol. 80, No. 2, Jan. 14, 2002.*

Baker et al., 'Characterization of Planar Semipolar Gallium Nitride Films on Spinel Substrates', Japanese Journal of Applied Physics, vol. 44, No. 29, 2005, pp. L920-L922.

Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.

Haskell et al., 'Defect Reduction in (1100) m-plane gallium nitride via lateral epitaxial overgrowth by hydride vapor phase epitaxy', Applied Physics Letters 86, 111917 (2005), pp. 1-3.

Sato et al., 'High Power and High Efficiency Semipolar InGaN Light Emitting Diodes', Journal of Light and Visible Environment, vol. 32, No. 2, Dec. 13, 2007, pp. 57-60.

Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.

Communication from the Japanese Patent Office re 2012-529969, dated Oct. 15, 2013, (6 pages).

Weaver et al., 'Optical Properties of Selected Elements', Handbook of Chemistry and Physics, 94th Edition, 2013-2014, pp. 12-126-12-150.

USPTO Office Action for U.S. Appl. No. 12/491,169 dated Oct. 22, 2010 (9 pages).

USPTO Office Action for U.S. Appl. No. 12/491,169 dated May 11, 2011 (9 pages).

USPTO Office Action for U.S. Appl. No. 12/497,289 dated Feb. 2, 2012 (6 pages).

USPTO Notice of Allowance for U.S. Appl. No. 12/497,289 dated May 22, 2012 (7 pages).

USPTO Office Action for U.S. Appl. No. 12/785,953 dated Apr. 12, 2012 (11 pages).

USPTO Office Action for U.S. Appl. No. 12/785,953 dated Jan. 11, 2013 (14 pages).

USPTO Office Action for U.S. Appl. No. 12/785,953 dated Oct. 3, 2013 (10 pages).

USPTO Office Action for U.S. Appl. No. 12/880,803 dated Feb. 22, 2012 (8 pages).

USPTO Notice of Allowance for U.S. Appl. No. 12/880,803 dated Jul. 18, 2012 (5 pages).

USPTO Office Action for U.S. Appl. No. 12/995,946 dated Mar. 28, 2012 (17 pages).

USPTO Office Action for U.S. Appl. No. 12/995,946 dated Jan. 29, 2013 (25 pages).

USPTO Office Action for U.S. Appl. No. 12/995,946 dated Aug. 2, 2013 (15 pages).

USPTO Office Action for U.S. Appl. No. 13/019,897 dated Dec. 2, 2013 (17 pages).

USPTO Notice of Allowance for U.S. Appl. No. 13/281,221 dated Nov. 12, 2013 (10 pages).

USPTO Office Action for U.S. Appl. No. 13/328,978 dated Sep. 26, 2013 (25 pages).

USPTO Office Action for U.S. Appl. No. 13/548,635 dated Jun. 14, 2013 (5 pages).

USPTO Notice of Allowance for U.S. Appl. No. 13/548,635 dated Sep. 16, 2013 (6 pages).

USPTO Notice of Allowance for U.S. Appl. No. 13/548,770 dated Jun. 25, 2013 (6 pages).

USPTO Office Action for U.S. Appl. No. 13/629,366 dated Oct. 31, 2013 (7 pages).

Motoki et al., 'Dislocation reduction in GaN crystal by advanced-DEEP', Journal of Crystal Growth, vol. 305, Apr. 1, 2007, pp. 377-383.

Communication from the Japanese Patent Office re 2013515583 dated Feb. 27, 2014, 2 pages.

USPTO Office Action for U.S. Appl. No. 12/569,841 dated Feb. 14, 2014, 20 pages.

USPTO Office Action for U.S. Appl. No. 13/012,674 dated Jan. 17, 2014, 15 pages.

Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.

Cich et al., 'Bulk GaN based violet light-emitting diodes with high efficiency at very high current density', Applied Physics Letters, Nov. 29, 2012, pp. 223509-1-223509-3.

Hanifin et al., 'Photoreception for Circadian, Neuroendocrine, and Neurobehavioral Regulation', Journal of Physiological Anthropology, vol. 26, 2007, pp. 87-94.

Iso et al., 'High Brightness Blue InGaN/GaN Light Emitting Diode on Nonpolar m-Plane Bulk GaN Substrate', Japanese Journal of Applied Physics, 2007, vol. 46, No. 40, pp. L960-L962.

Kim et al., 'High Brightness Light Emitting Diodes Using Dislocation-Free Indium Gallium Nitride/Gallium Nitride Multiquantum—Well Nanorod Arrays', Nano Letters, vol. 4, No. 6, 2004, pp. 1059-1062.

International Search Report & Written Opinion of PCT Application No. PCT/US2013/029453, dated Jul. 25, 2013, 11 pages total.

http://www.philipslumileds.com/products/luxeon-flash, 'LUXEON Flash', Philips Lumileds, Aug. 8, 2013, pp. 1-2.

Rea et al., 'White Lighting', COLOR Research and Application, vol. 38, No. 2, Sep. 3, 2011, pp. 82-92.

Communication from the Korean Patent Office re 10-2012-7009980 dated Apr. 15, 2013, 6 pages.

USPTO Office Action for U.S. Appl. No. 12/481,543 dated Jun. 27, 2011, 10 pages.

USPTO Office Action for U.S. Appl. No. 12/569,841 dated Dec. 23, 2011, 13 pages.

(56) References Cited

OTHER PUBLICATIONS

USPTO Office Action for U.S. Appl. No. 12/569,841 dated Mar. 26, 2013, 18 pages.
USPTO Office Action for U.S. Appl. No. 12/569,841 dated Aug. 13, 2013, 21 pages.
USPTO Office Action for U.S. Appl. No. 12/569,844 dated Oct. 12, 2012, 12 pages.
USPTO Notice of Allowance for U.S. Appl. No. 12/569,844 dated Mar. 7, 2013, 9 pages.
USPTO Office Action for U.S. Appl. No. 12/634,665 dated Apr. 25, 2012, 11 pages.
USPTO Notice of Allowance for U.S. Appl. No. 12/720,593 dated Jul. 11, 2012, 7 pages.
USPTO Office Action for U.S. Appl. No. 12/749,466 dated Jul. 3, 2012, 18 pages.
USPTO Office Action for U.S. Appl. No. 12/749,476 dated Apr. 11, 2011, 15 pages.
USPTO Office Action for U.S. Appl. No. 12/749,476 dated Nov. 8, 2011, 11 pages.
USPTO Notice of Allowance for U.S. Appl. No. 12/749,476 dated May 4, 2012, 8 pages.
USPTO Notice of Allowance for U.S. Appl. No. 12/749,476 dated Jun. 26, 2012, 8 pages.
USPTO Office Action for U.S. Appl. No. 12/861,765 dated Jul. 2, 2012, 12 pages.
USPTO Office Action for U.S. Appl. No. 12/861,765 dated Mar. 7, 2013, 13 pages.
USPTO Office Action for U.S. Appl. No. 12/861,765 dated Sep. 17, 2013, 10 pages.
USPTO Office Action for U.S. Appl. No. 12/879,784 dated Jan. 25, 2012, 7 pages.
USPTO Notice of Allowance for U.S. Appl. No. 12/879,784 dated Apr. 3, 2012, 7 pages.
USPTO Office Action for U.S. Appl. No. 12/936,238 dated Aug. 30, 2012, 12 pages.
USPTO Office Action for U.S. Appl. No. 12/936,238 dated Jan. 30, 2013, 12 pages.
USPTO Notice of Allowance for U.S. Appl. No. 12/936,238 dated Apr. 16, 2013, 10 pages.
USPTO Office Action for U.S. Appl. No. 13/014,622 dated Nov. 28, 2011, 14 pages.
USPTO Office Action for U.S. Appl. No. 13/014,622 dated Apr. 30, 2012, 14 pages.
USPTO Office Action for U.S. Appl. No. 13/019,897 dated Mar. 30, 2012, 15 pages.
USPTO Office Action for U.S. Appl. No. 13/019,897 dated Jan. 16, 2013, 16 pages.
USPTO Office Action for U.S. Appl. No. 13/025,833 dated Jul. 12, 2012, 16 pages.
USPTO Notice of Allowance for U.S. Appl. No. 13/163,482 dated Jul. 31, 2012, 5 pages.
USPTO Office Action for U.S. Appl. No. 13/179,346 dated Aug. 17, 2012, 21 pages.
USPTO Office Action for U.S. Appl. No. 13/179,346 dated Dec. 13, 2012, 24 pages.
USPTO Office Action for U.S. Appl. No. 13/281,221 dated Jun. 21, 2013, 6 pages.
USPTO Office Action for U.S. Appl. No. 13/328,978 dated May 15, 2013, 25 pages.
USPTO Office Action for U.S. Appl. No. 13/465,976 dated Aug. 16, 2012, 17 pages.
USPTO Office Action for U.S. Appl. No. 13/465,976 dated Dec. 20, 2012, 17 pages.

* cited by examiner

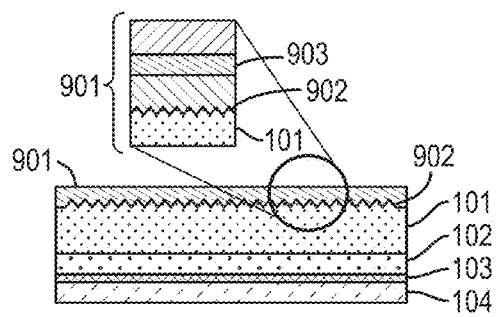
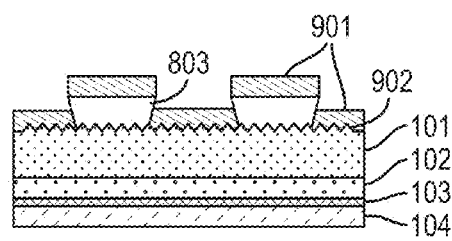
FIG. 9A    FIG. 9B
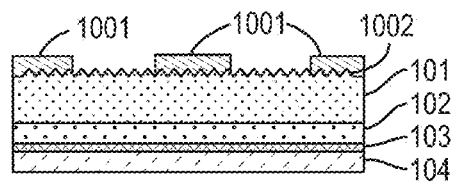
FIG. 10
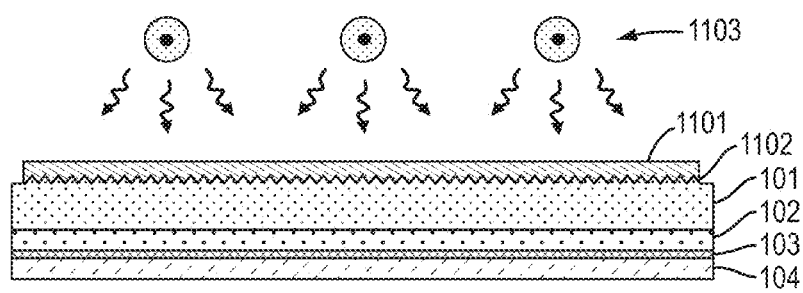
FIG. 11

US 8,802,471 B1

CONTACTS FOR AN N-TYPE GALLIUM AND NITROGEN SUBSTRATE FOR OPTICAL DEVICES

FIELD

The present invention relates to techniques for manufacturing optical devices. More particularly, the present invention includes light emitting diodes and in particular to ohmic contacts for light emitting diodes.

BACKGROUND

A metric for the efficiency of light emitting diodes (LEDs) is the luminance per watt. The luminance provided by light emitting diodes is dependent upon several factors, such as internal quantum efficiency, which quantifies the fraction of injected carriers converted to photons, or extraction efficiency, which quantifies the fraction of photons successfully extracted from the light emitting diode. Internal absorption may prevent photons from escaping the light emitting diode. To realize high efficiency LEDs, both the internal efficiency and extraction efficiency should be addressed. The potential gains from improving extraction efficiency, however, are likely to be greater and simpler to accomplish than the gains from improving internal efficiency.

From the above, it is seen that improved techniques for manufacturing optical devices are highly desired.

SUMMARY

In an example, the present invention provides a method for fabricating LED devices. The method includes providing a gallium and nitrogen containing substrate member (e.g., GaN) comprising a backside surface and a front side surface. The front side surface includes an n-type material overlying the substrate member, an active region overlying the n-type member, and a p-type material overlying the active region. The method includes subjecting the backside surface to a polishing process, causing a backside surface characterized by a surface roughness. The method also includes subjecting the backside surface to an anisotropic etching process exposing various crystal planes to form a plurality of pyramid-like structures distributed spatially in a non-periodic manner on the backside surface. The method includes treating the backside surface, comprised of a plurality of pyramid-like structures, to a plasma species, and subjecting the backside surface to a surface treatment. The method forms a contact material comprising an aluminum bearing species or a titanium bearing species overlying the surface-treated backside to form a plurality of LED devices with the contact material.

Various additional objects, features and advantages of the present invention can be more fully appreciated with reference to the detailed description and accompanying drawings that follow.

BRIEF DESCRIPTION OF THE DRAWINGS

In FIG. 5, the distance from the leftmost marker to the rightmost marker is 10 μm.

FIG. 9A and FIG. 9B are illustrations of metal layers deposited on the n-GaN surface (the stack begins with a first layer of Al or Ti, followed by a barrier layer) according to embodiments of the present invention.

FIG. 10 illustrates a resulting substrate structure where solvents are used to remove photoresist and unwanted metal in a liftoff process according to an embodiment of the present invention.

FIG. 11 illustrates a process for treatment of metal annealed to reduce the contact resistance according to an embodiment of the present invention.

In FIGS. 12-14, the distance from the leftmost marker to the rightmost marker is 10 μm. In FIG. 15, the distance from the leftmost marker to the rightmost marker is 5 μm. In FIG. 16, the distance from the leftmost marker to the rightmost marker is 2 μm.

DETAILED DESCRIPTION

Figure 1:
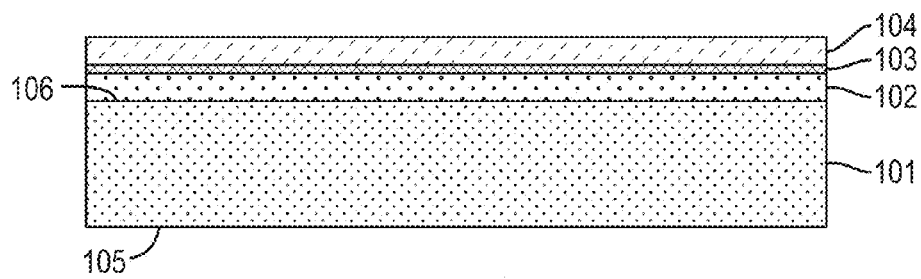
FIG. 1 is a simplified diagram of an n-type c-plane GaN substrate with epitaxial LED structure (n-layer, active region, p-layer) according to an embodiment of the present invention.

The present invention relates to techniques for manufacturing optical devices. More particularly, the present invention includes light emitting diodes and in particular, ohmic contacts for light emitting diodes. Such light emitting devices can include LEDs, lasers and the like. Progress has been made during the past decade and a half in the performance of gallium nitride (GaN) based light emitting diodes (LEDs). Devices with a luminous efficiency greater than 100 lumens per watt have been demonstrated in the laboratory, and commercial devices have an efficiency that is already considerably superior to that of incandescent lamps, and competitive with fluorescent lamps. Further improvements in efficiency can reduce operating costs, reduce electricity consumption, and decrease emissions of carbon dioxide and other greenhouse gases produced in generating the energy used for lighting applications.

As background information, we have observed that conventional GaN-based light emitting diodes (LED) emitting in the ultraviolet and visible regions are based on heteroepitaxial growth where growth is initiated on a substrate other than GaN such as sapphire, silicon carbide, or silicon. This is due to the limited supply and high cost of free-standing GaN substrates, which has prevented their viability for use in LED manufacture. However, the field of bulk-GaN technology has seen rapid gains over the past couple of years providing promise for large-scale deployment into LED manufacture. Such a technology shift will provide huge benefits to LED performance and manufacturing.

Light extraction of LEDs emitting in the visible portion of the spectrum, such as gallium nitride (GaN) LEDs, can be improved through the use of high reflectivity metallurgies, which are typically mounted to one side of the LED. A desirable electrical contact to a GaN-based device has a reduced impact on the operating voltage of the device. This is typically accomplished through the use of ohmic contacts. Thus, a desirable metal contact to an LED is both ohmic and highly reflective. A common approach for making contact to p-GaN is to use a silver-containing layer. Silver is desirable because of its high reflectance across a large portion of the visible spectrum. Though highly reflective, silver does not make good electrical contacts to n-GaN. The carrier energies in n-GaN dictate that a metal with a different work function be chosen for ohmic contacts. However, metal reflectivity and work function are not the sole concerns of ohmic contact formation. The processing method should also address surface contamination, and in the case of GaN, relative amounts of exposed Ga and N atoms at the surface. Therefore, making metal contacts to GaN LEDs is a complex endeavor that should take into consideration optical and electrical metal properties, semiconductor crystal properties, and surface chemistry.

In an embodiment, a method to produce an ohmic contact to n-type GaN is provided. This method involves three steps, starting with a polished GaN surface: an alkaline treatment, a plasma treatment, and an acid treatment. The alkaline treatment can be central to the success of the method, since it produces fine scale roughness that exposes alternate crystal facets, which may be more favorable to ohmic contact formation. The plasma treatment and acid treatment are more in line with conventional surface cleaning methods before metal deposition.

Ohmic contacts are desirable for manufacturing LEDs with high electrical efficiency. There have been attempts to manufacture contacts to LEDs using different metallization pre-treatments, metal thin film stacks, and annealing treatments to obtain ohmic contacts to n-type and p-type GaN. For LEDs, it is also desirable to have an ohmic contact metal with high reflectivity. In addition, lower annealing temperatures are generally favored.

For example, a present method for fabricating a device with an ohmic n-contact includes laser scribing Ti/Au contacts. This method forms (e.g., cuts, etches, patterns, drills, machines) trenches into the n-contacts approximately 10 microns to 30 microns deep. The laser scribe effectively anneals the n-contact metal at a very high temperature and mixes it into the GaN. However, the trenches get filled with a high optical loss metal alloy, and the surface of the contact gets covered with burned metal, which makes it hard to test the contacts and impacts wire-bond yield and reliability due to gradual intermetallic reactions. This disclosure describes a method for achieving low contact resistance to n-type GaN using a chemical solution that produces a small scale (height<0.1 micron; pitch<2 microns) roughness on the GaN surface. Further details of the present invention can be found throughout the present specification and more particularly below.

FIG. 1 is a simplified diagram of an n-type c-plane GaN substrate 101 with epitaxial LED structure (n-layer 102, active region 103, p-layer 104) according to an embodiment of the present invention. As shown, the method begins with a gallium and nitrogen containing substrate member 101. The substrate includes a backside surface 105 and a front side surface 106. The front side surface 106 includes an n-type material 102 overlying the substrate member, an active region 103 overlying the n-type member 102, and a p-type material 104 overlying the active region 103. In certain embodiments, the active region has one or more quantum wells that emit light at visible or ultraviolet wavelengths.

Figure 2:
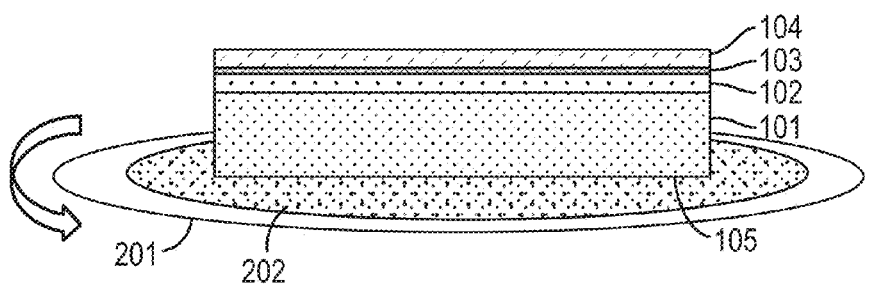
FIG. 2 illustrates polishing of n-type layer with diamond slurry until optically smooth (RMS surface roughness 100 nm or less) according to an embodiment of the present invention.

FIG. 2 illustrates polishing of n-type substrate with a diamond slurry until the surface is optically smooth (RMS surface roughness 100 nm or less) according to an embodiment of the present invention. As shown, the method includes subjecting the backside surface 105 to polishing process to cause the backside surface characterized by a surface roughness of 100 nanometers RMS. Wafers are mounted on a rotating plate 201, which sits, for example, on a large polyurethane impregnated polyester felt polishing pad 202. The polishing pad 202 is rotated at rate ranging from about 5 rpm to about 200 rpm or about 60 rpm or other speeds, while the plate with the wafers rotates at about 1 rpm to 25 rpm and in certain embodiments about 10 rpm, among others. A slurry mixture is a suspension of suitably-sized abrasive particles ranging in size from about 0.05 μm to 5 μm, and in certain embodiments, 1 μm diamond particles or other abrasive species such as other metals, semiconductors, conductors, and combinations of any of the foregoing, such as, for example SiC, diamond, $Al_2O_3$, and/or GaN. The slurry mixture also includes a neutral solvent such as water and/or alcohol and can also be acidic or basic. The slurry mixture is dispensed onto the polishing pad during the method.

Figure 3:
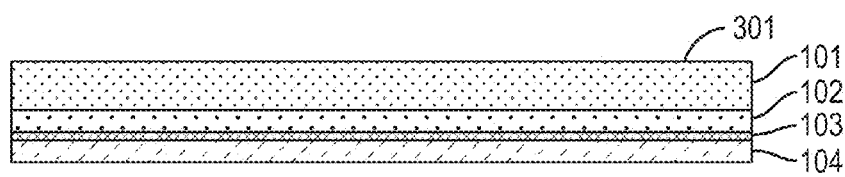
FIG. 3 is a substrate with optically smooth nitrogen face of c-plane GaN prepared by polishing or lapping and polishing according to an embodiment of the present invention.

FIG. 3 shows a substrate with an optically smooth nitrogen face 301 of c-plane GaN, prepared by polishing or lapping and polishing according to an embodiment of the present invention. As shown, the optically smooth nitrogen face 301 is characterized by a surface roughness of between 200 nm RMS and 0.3 nm RMS and other ranges. As used herein, the term nitrogen face typically means an outermost and/or surface region and/or layer of atoms is comprised substantially of nitrogen atoms, although there may be some variations, or other meanings consistent with the understanding of one of ordinary skill of the art. As an example, a nitrogen face can include an exposed c-plane.

Figure 4:
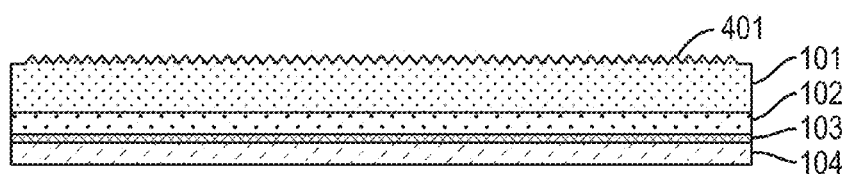
FIG. 4 is an n-GaN surface roughened by exposure to a solution of silicic acid hydrate, potassium hydroxide (KOH), and water according to an embodiment of the present invention.

FIG. 4 shows an n-GaN surface 401 roughened by exposure to a solution of silicic acid hydrate, KOH, and water according to an embodiment of the present invention. The solution of silicic acid hydrate, KOH, and water are mixed in the proportion of about 60 g silicic acid hydrate per liter of 9% KOH solution. The height and pitch of the roughness can be controlled by the silicic acid and KOH concentrations. The temperature of the etchant is held at, for example, 60° C. In certain embodiments, the anisotropic etching process comprises the use of a solution comprising silicic acid and potassium hydroxide. In certain embodiments, the solution comprises 0% to 20% by weight of silicic acid hydrate, and 3% to 45% by weight potassium hydroxide in water. In certain embodiments, the backside surface is immersed in the roughening solution for at least 1 minute at a temperature from 0° C. to 100° C. The etchant is continuously agitated to provide uniformity of roughness. Although the method used a selected chemistry and conditions for the etchant, there can be variations. For example, the acid can also be boric acid, chloro-sulfonic acid, sulfamic acid, or others. As shown, the method subjects the backside surface to a crystal plane dependent etching process to form a plurality of pyramidal like structures formed spatially in an even manner on the backside surface, as further shown in FIG. 5. Each of the pyramid-like structures generally includes at least 6 sides configured and extending from an apex to a base region. The pyramid-like structures are configured such that each of the base regions substantially covers a plane in a manner where the base regions are coupled to each other without exposing the plane. At least 80% of the pyramid-like structures have a base region having a normalized size ranging from 0.3 to 3 relative to the median base size. In one example, the median base size is 0.5 µm. The plurality of the pyramid-like structures can form a non-periodic spatial pattern, although there may be variations. In an example, the distance between the base of a pyramid-like structure and the apex of the pyramid-like structure is twice the length of the base.

Figure 5:
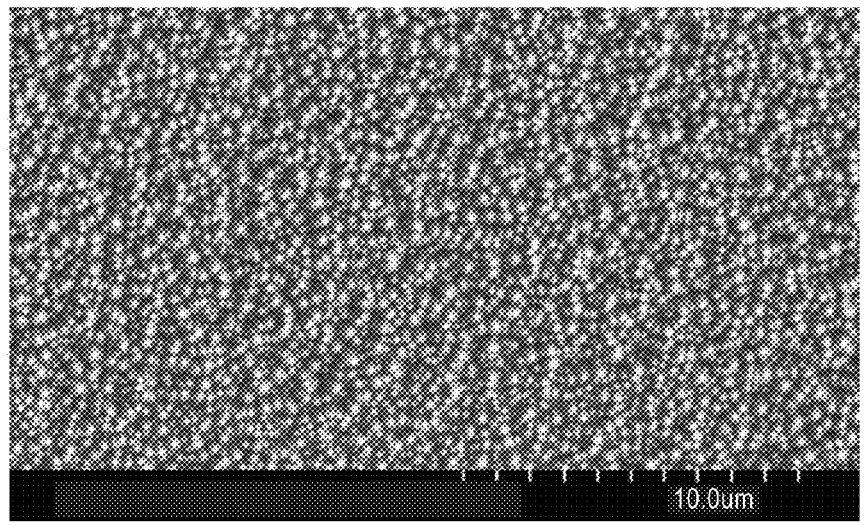
FIG. 5 is a scanning electron microscope image of roughened n-GaN surface after exposure to solution of silicic acid hydrate, KOH and water according to an embodiment of the present invention.

FIG. 5 is a scanning electron microscope image of a roughened n-GaN surface after exposure to a solution of silicic acid hydrate, KOH, and water according to an embodiment of the present invention. This image is merely an example and should not unduly limit the scope of the claims defined herein. Further details of the present method and structure can be found throughout the present specification and more particularly below.

Figure 6:
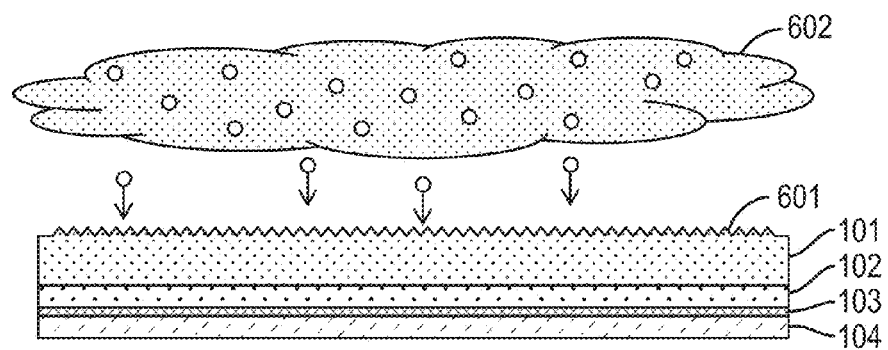
FIG. 6 is a simplified n-GaN surface etched by $SiCl_4$ plasma according to an embodiment of the present invention.

FIG. 6 shows a simplified illustration of a roughened n-GaN surface 601 etched by a $SiCl_4$ plasma 602 according to an embodiment of the present invention. Although the $SiCl_4$-based plasma is described, there can be variations. In certain embodiments, the plasma species comprises a silicon species and a chlorine species. In certain embodiments, the plasma species comprises a silicon species and a chlorine species derived from a silicon tetrachloride gas source. As shown, the method treats the backside surface comprising the plurality of pyramidal-like structures 601 to a plasma treatment. The plasma 602 is created by applying a bias voltage across $SiCl_4$ gas. In this example, the subject plasma treatment processes the roughened GaN surface 601 to achieve an ohmic contact. It is believed that the plasma surface treatment alters a chemical characteristic of the roughened GaN surface to facilitate the ohmic contact formation.

Figure 7:
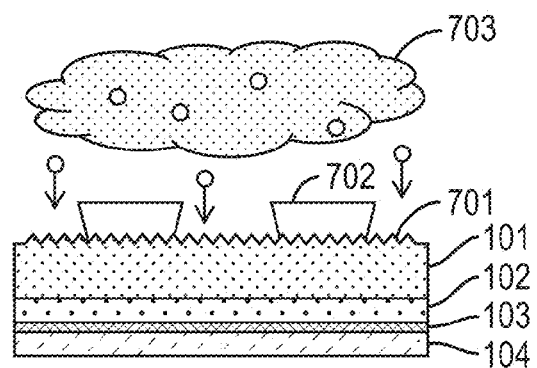
FIG. 7 is an illustration of a photoresist-patterned substrate treated with an oxygen plasma, followed by a $SiCl_4$ plasma treatment (when the n-contacts will be patterned using a lift-off process) according to an embodiment of the present invention.

FIG. 7 is an illustration of a photoresist-patterned roughened n-GaN surface 701 treated with an oxygen plasma, followed by a $SiCl_4$ plasma treatment (when the n-contacts will be patterned using a lift-off process) according to an embodiment of the present invention. As shown, the photoresist 702 patterned wafer is exposed to an oxygen plasma, which removes residual organic contaminants in the contact windows. This is followed by a $SiCl_4$ plasma 703 treatment. The present technique using the oxygen plasma provides a residue-free surface.

Figure 8A:
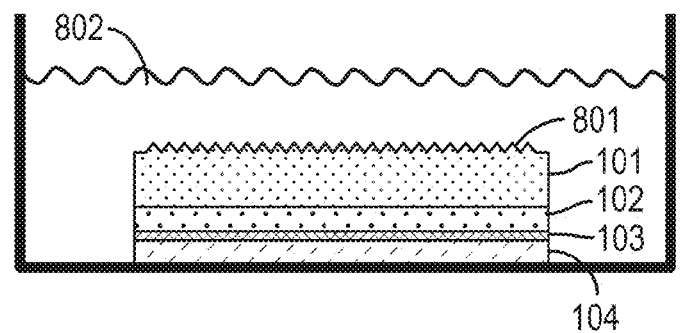
FIG. 8A and FIG. 8B illustrate a process for HCl treatment of an n-GaN surface, with (FIG. 8A) or without (FIG. 8B) patterned photoresist according to an embodiment of the present invention.
Figure 8B:
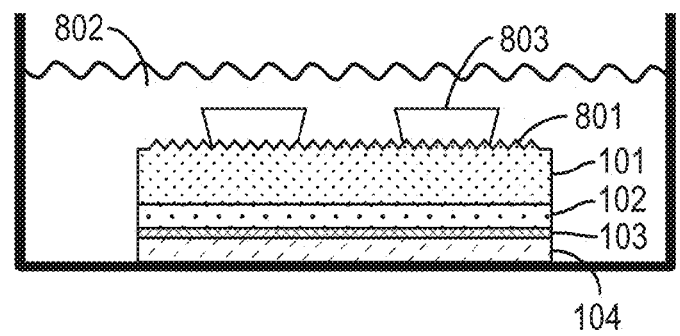
Figure 12:
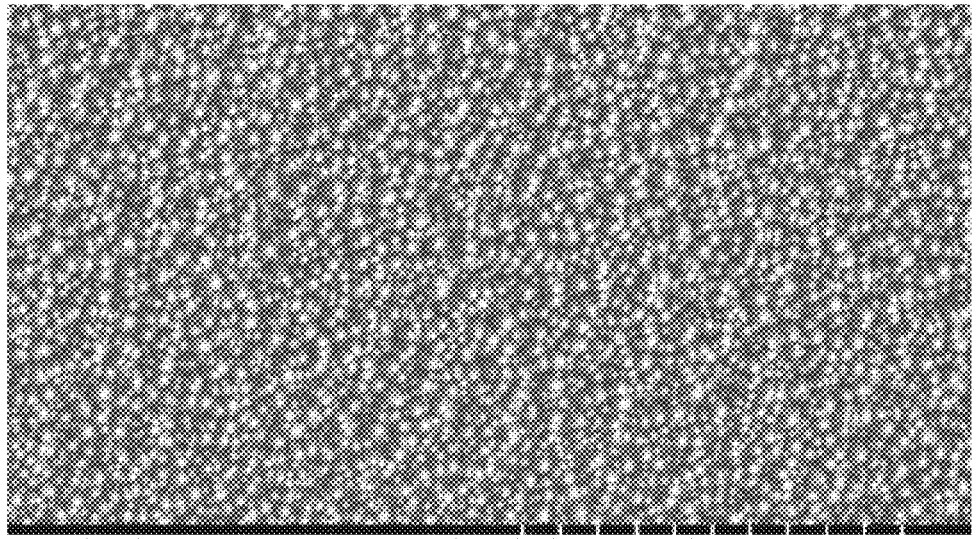
FIGS. 12 through 16 illustrate images of roughened surface regions, including pyramidal structures, according to embodiments of the present invention.
Figure 13:
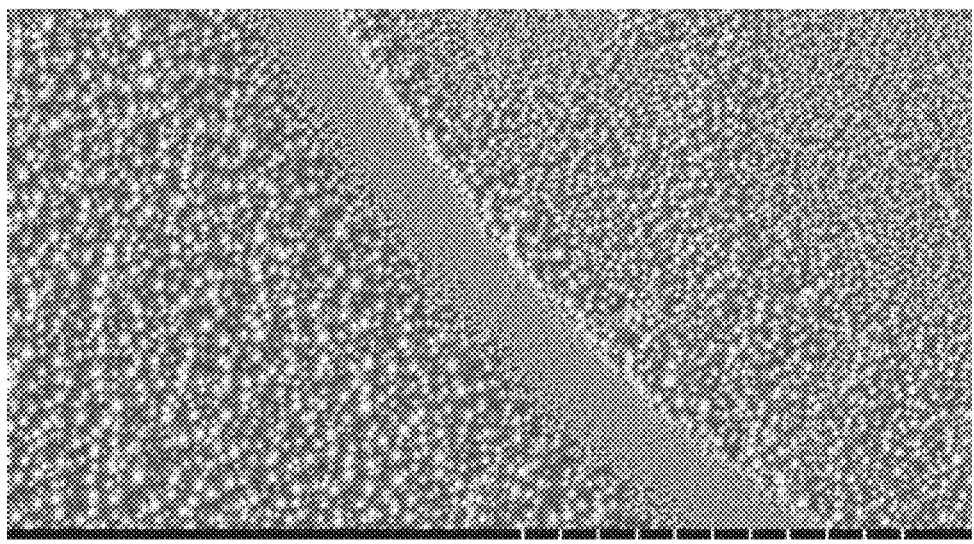
Figure 14:
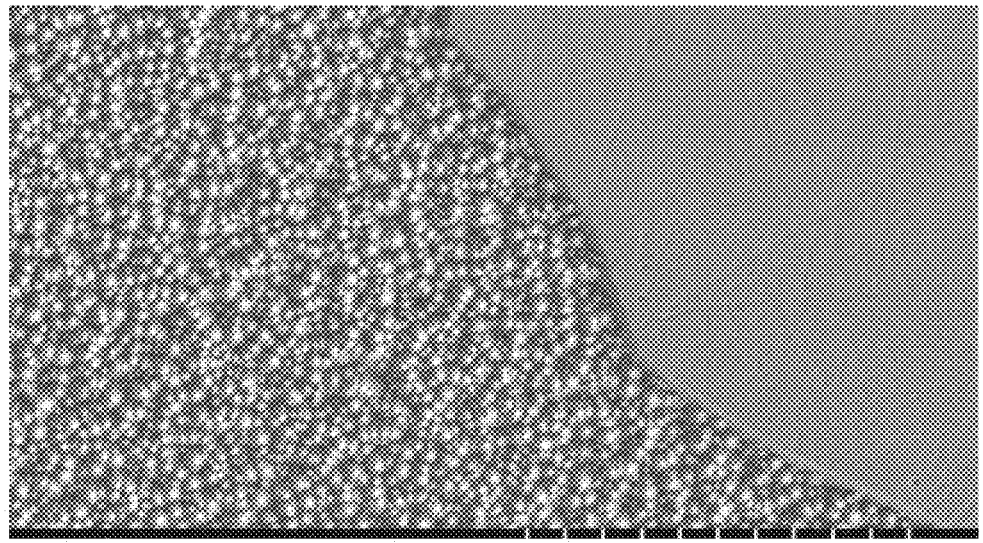
Figure 15:
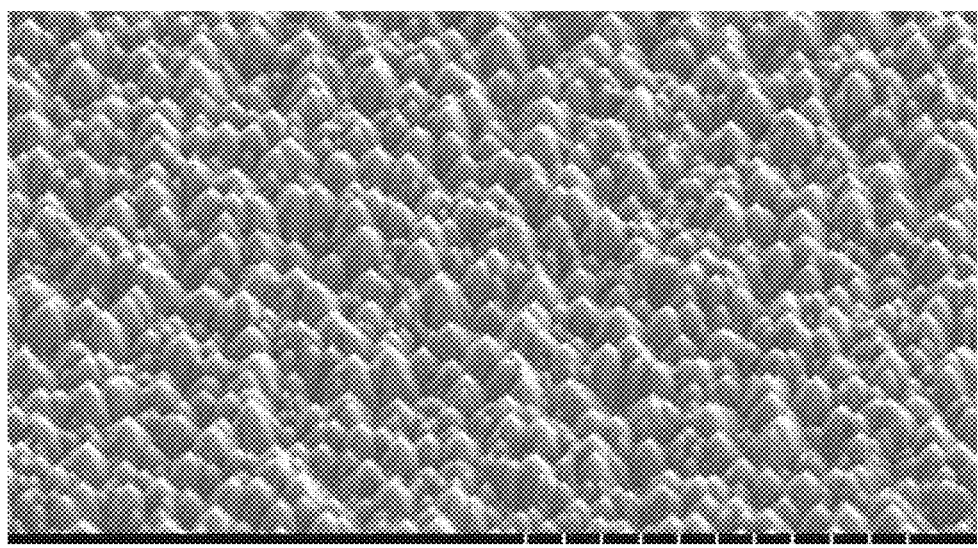
Figure 16:
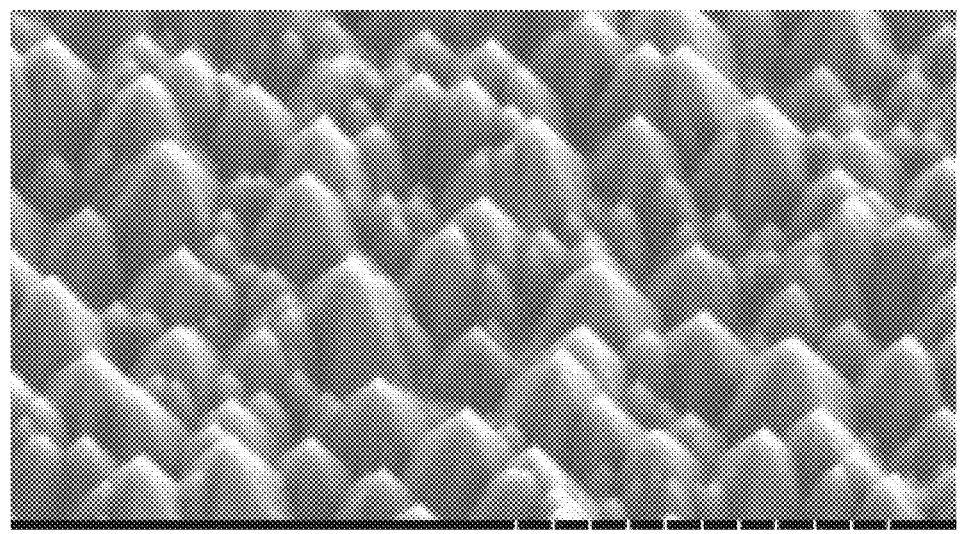

FIGS. 8A and 8B illustrate a process for HCl treatment of a roughened n-GaN surface, with (FIG. 8A) or without (FIG. 8B) patterned photoresist 803 according to embodiments of the present invention. The method subjects the roughened n-GaN surface 801 to hydrochloric acid 802. Typically the HCl is an aqueous solution with a concentration of 38% by weight and may be diluted. Other treatments including acids of other types may be used. This surface treatment may be performed at room temperature or at elevated temperatures, and extends for 1 to 20 minutes in duration in an example. In certain embodiments, the surface is treated for at least about 1 minute, and in certain embodiments, at least about 5 minutes. In this example, the acid treatment processes the roughened GaN surface to achieve an ohmic contact. It is believed that the acid treatment alters a chemical characteristic of the roughened GaN surface to facilitate the ohmic contact formation.

FIGS. 9A and 9B show illustrations of metal layers 901 deposited on a treated n-GaN surface 902. A stack or single layer begins with a first layer 903 of Al or Ti according to an embodiment of the present invention. The stack 901 can include any combination of suitable conductive materials with barrier and/or adhesive layers. The stack 901 can be a homogeneous structure, a graded structure, composed of discrete stacked regions, or any combination of the foregoing structures. Other suitable metals may be used, including Zn, Ag, Au, W, Cr, Ni, or others including, but not limited to, alloys. As shown, the method includes a blanket deposition of contact material comprising an aluminum bearing species or a titanium bearing species overlying the treated n-GaN surface to form a plurality of LED devices using this contact material.

FIG. 10 illustrates a resultant patterned metal 1001 on a treated n-GaN surface 1002 in which organic solvents are used to remove photoresist and unwanted metal in a liftoff process according to an embodiment of the present invention. As an example, the solvents used in the liftoff process include N-methyl-2-pyrrolidone (NMP) or acetone followed by methanol and isopropanol. Other processes may be used to pattern the metal, including an etch-back process. FIG. 10 shows patterned metal conductors 1001 overlying treated n-GaN surface 1002, overlying substrate 101, n-layer 102, active region 103, and p-layer 104.

FIG. 11 illustrates a process for treatment of metal annealing to lower the contact resistance according to an embodiment of the present invention. The final contact structure 1101 is subjected to annealing in a nitrogen or forming gas (nitrogen and hydrogen) environment 1103. The temperature can range from 200° C. to 450° C., among others. Further details of the present method can be found according to the descriptions below. FIG. 10 shows patterned metal conductors 1101 overlying treated n-GaN surface 1102, overlying substrate 101, n-layer 102, active region 103, and p-layer 104.

FIGS. 12 through 16 are scanning electron micrograph images of roughened surface regions, including pyramidal-like structures, according to embodiments of the present invention. In an example, each of the plurality of pyramidal-like structures has a height from about 20 nm to 1,000 nm, from about 20 nm to about 500 nm, from about 20 nm to about 250 nm, from about 20 nm to about 100 nm, or can be others. In an example, each of the pyramid-like structures generally includes at least 6 sides configured and extending from an apex to a base region. The pyramid-like structures are configured such that each of the base regions substantially covers a plane in a manner in which the base regions are coupled to each other without exposing the plane. At least 80% of the pyramid-like structures have a base region having a normalized dimension ranging from 0.3 to 3 relative to the median base dimension. In certain embodiments, at least 80% of the pyramid-like structures have a base region having a normalized dimension ranging from 0.1 to 5 relative to the median base dimension. In one example, the median base dimension is 0.5 µm. In certain embodiments, the median base dimension is from about 0.1 µm to about 3 µm, from about 0.2 µm to about 2 µm, from about 0.3 µm to about 1.5 µm, and in certain embodiments, from about 0.3 µm to about 1 µm. The plurality of the pyramid-like structures can form a non-periodic spatial pattern, although there may be variations. In an example, the distance between the base and the apex is twice the length of the base. In certain embodiments, the distance between the base and the apex is from about 0.5 to about 3 times the length of the base.

Figure 17:
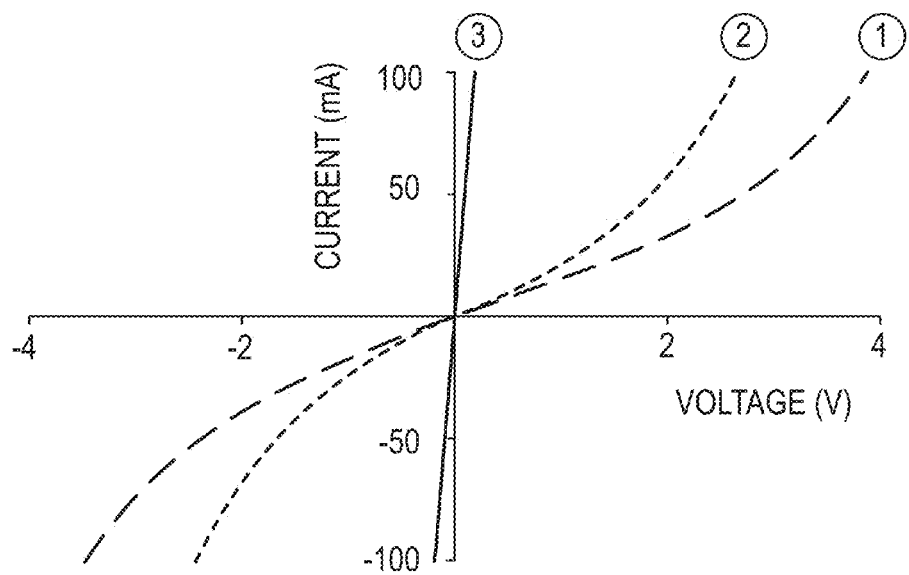
FIG. 17 illustrates one example of measured current as a function of voltage between aluminum contacts on n-GaN with the treatments described, compared to contacts to an untreated n-GaN surface.

FIG. 17 is a graph showing the current between two aluminum contacts on n-GaN for varying voltage. The first curve (1) shows a typical result when aluminum is placed on n-GaN without chemical roughening treatment or plasma exposure. The second curve (2) shows the improvement when the surface is exposed to silicic acid/KOH roughening solution and SiCl$_4$ plasma treatment and HCl cleaning. The third curve (3) shows the result when the contacts of curve (2) are annealed at 340° C. for 5 seconds. The linear IV curve (3) is characteristic of an ohmic contact.

In an example, the present method includes the following sequence of steps:

(1) Lap and polish a nitrogen face of c-plane, n-type GaN with a carrier concentration of $1\times10^{18}$/cm$^3$.

(2) Prepare a silicic acid-potassium hydroxide solution, with the composition of 14.6 g of silicic acid hydrate, 20 mL of 45% KOH solution, and 100 mL of water.

(3) Immerse the polished surface of the n-type GaN substrate in silicic acid—potassium hydroxide solution for 15 min at 60° C.

(4) Perform standard n-contact liftoff lithography:

Lithography is not required except to form the contact pattern. This step may be skipped and a blanket deposition/etchback used.

(5) Descum (optional), for example, using ozone cleaning, or ozone plasma.

(6) Expose the sample to SiCl$_4$ plasma, for example,

Reactive ion etching at 400 W and 30 mTorr SiCl$_4$.

(7) Deionized water rinse.

(8) Immerse the sample in HCl (37%) for 5 min.

(9) Deionized water rinse.

(10) Deposit contact metallization, such as evaporated aluminum, aluminum/nickel/gold, and/or titanium/gold.

(11) Anneal. Depending on the treatment conditions, contacts are ohmic as deposited, or require mild annealing between 200° C. and 450° C. to be ohmic.

This sequence of steps is merely illustrative, and should not limit the scope of the claims herein. Depending upon the embodiment, the steps may be further combined, or other steps may be added. Alternatively, the steps may be reordered, depending upon the embodiment.

GaN substrates that underwent plasma exposure only, or acid clean only, had high-resistance contacts. Plasma exposures included both SiCl$_4$ plasma and chlorine-based plasmas. Acid cleaning included HCl, buffered oxide etch, and/or HF. GaN substrates that did not receive plasma exposure sometimes had ohmic contacts as deposited, but became high-resistance contacts on mild annealing (340° C., 5 second). Substrates exposed to alkaline cleaning, plus plasma treatment and acid dip, had generally high contact resistance as-deposited, but the contact resistance dropped below the current laser-scribed value after a 340° C., 5 second anneal.

It should be understood that the description recited above is an example of the invention and that modifications and changes to the examples may be undertaken which are within the scope of the claimed invention. Therefore, the scope of the appended claims should be accorded the broadest interpretation so as to encompass all such modifications and similar arrangements, including a full scope of equivalents.

What is claimed is:

1. A method for fabricating LED devices, the method comprising:

providing a gallium and nitrogen containing substrate member comprising a backside surface and a front side surface, the front side surface including an n-type material overlying the substrate member, an active region overlying the n-type material, and a p-type material overlying the active region;

subjecting the backside surface to a polishing process, causing a backside surface characterized by a surface roughness;

subjecting the backside surface characterized by a surface roughness to an anisotropic etching process exposing various crystal planes to form a plurality of pyramid-like structures distributed spatially in a non-periodic manner on the backside surface, wherein the anisotropic etching process comprises use of a solution comprising silicic acid and potassium hydroxide;

treating the backside surface comprising the plurality of pyramid-like structures, to a plasma species to form a plasma-treated backside surface;

subjecting the plasma-treated backside surface to a surface treatment to form a surface-treated backside; and forming a contact material comprising an aluminum bearing species or a titanium bearing species overlying the surface-treated backside to form a plurality of LED devices with the contact material.

2. The method of claim 1, wherein the backside surface is characterized by a nitrogen face of a c-plane, and n-type GaN characterized by a carrier concentration ranging from $1\times10^{15}$/cm$^3$ to $1\times10^{20}$/cm$^3$; wherein the surface roughness ranges from about 0.3 nm to 200 nm.

3. The method of claim 1, wherein the polishing process comprises use of a diamond slurry mixture characterized by a particle size ranging from 0.05 microns to 5 microns.

4. The method of claim 1, wherein each of the plurality of pyramidal-like structures is characterized by a height from about 20 nm to about 1,000 nm.

5. The method of claim 1, wherein the solution comprises 0% to 20% by weight silicic acid hydrate, and 3% to 45% by weight potassium hydroxide in water.

6. The method of claim 5, wherein the backside surface is immersed in the solution for at least 1 minute at a temperature from 0° C. to 100° C.

7. The method of claim 1, wherein the plasma species comprises a silicon species and a chlorine species derived from a silicon tetrachloride gas source.

8. The method of claim 1, wherein the surface treatment comprises an HCl immersion for at least one minute.

9. The method of claim 1, further comprising subjecting the LED devices to a thermal treatment process to form an ohmic contact between each LED device and the contact material.

10. A method for fabricating LED devices, the method comprising:

providing a gallium and nitrogen containing substrate member comprising a backside surface and a front side surface, the front side surface including an n-type material overlying the substrate member, an active region overlying the n-type material, and a p-type material overlying the active region;

subjecting the backside surface to a polishing process, causing a backside surface characterized by a surface roughness;

subjecting the backside surface characterized by a surface roughness to an anisotropic etching process exposing various crystal planes to form a plurality of pyramid-like structures distributed spatially in a non-periodic manner on the backside surface, the plurality of pyramid-like structures characterizing a roughened region overlying a plane within a vicinity of the backside region, wherein the anisotropic etching process comprises use of a solution comprising silicic acid and potassium hydroxide;

treating the backside surface, comprising a plurality of pyramid-like structures, to a plasma species to form a plasma-treated backside surface;

subjecting the plasma-treated backside surface to a surface treatment to form a surface-treated backside; and forming a contact material comprising an aluminum bearing species or a titanium bearing species overlying the surface-treated backside to form a plurality of LED devices with the contact material such that the contact material forms an ohmic contact with the surface-treated backside of each of the plurality of LED devices.

11. The method of claim 10, wherein the backside surface is characterized by a nitrogen face of a c-plane, n-type GaN with carrier concentration ranging from $1\times10^{15}/cm^3$ to $1\times10^{20}/cm^3$; wherein the surface roughness ranges from about 0.3 nm to about 200 nm.

12. The method of claim 10, wherein the polishing process comprises use of a diamond slurry mixture characterized by a particle size from 0.05 microns to 5 microns.

13. The method of claim 10, wherein each of the plurality of pyramidal like structures is characterized by a height from 20 nm to 1000 nm.

14. The method of claim 10, wherein the solution comprises 0% to 20% by weight silicic acid hydrate, and 3% to 45% by weight potassium hydroxide in water.

15. The method of claim 14, wherein the backside surface is immersed in the solution for at least 1 minute at a temperature from 0° C. to 100° C.

16. The method of claim 10, wherein the plasma species comprises a silicon species and a chlorine species derived from a silicon tetrachloride gas source.

17. The method of claim 10, wherein the surface treatment comprises an HCl immersion for at least one minute.

18. The method of claim 10 further comprising subjecting the LED devices to a thermal treatment process to form the ohmic contact between each LED device and the contact material.

* * * * *